July 11, 1967

P. E. OBERG

MASKING DEVICE

Filed Sept. 10, 1964

3,330,252

INVENTOR.
PAUL E. OBERG

BY Thomas J. Nikolai
ATTORNEY

United States Patent Office 3,330,252

Patented July 11, 1967

3,330,252

MASKING DEVICE

Paul E. Oberg, Minneapolis, Minn., assignor to Sperry Rand Corporation, New York, N.Y., a corporation of Delaware Filed Sept. 10, 1964, Ser. No. 395,381
5 Claims. (Cl. 118—49.1)

ABSTRACT OF THE DISCLOSURE

An arrangement for supporting a thin flexible mask in intimate contact with a substrate over the entire area of the mask wherein an electrical potential is established between the mask and substrate to create an electrostatic force which attracts the two together. Such an arrangement finds particular utility in a vacuum metalization apparatus.

Figure 1:
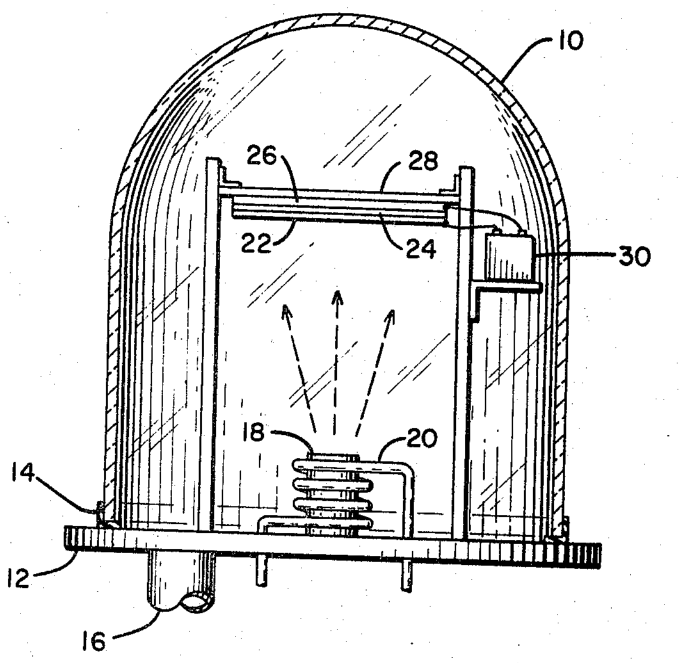

This invention relates generally to apparatus for forming patterned coatings on a support member and more specifically to a novel arrangement for maintaining a mask in contact with said support member such that a high degree of definition in the coating pattern can be achieved.

In the Rubens patent, 2,900,282, issued August 18, 1959, there is disclosed a method of preparing thin ferromagnetic storage elements by vacuum depositing an iron-nickel alloy on a substrate in the presence of an orienting magnetic field. Located within the vacuum chamber is a source of metallic vapor which is positioned with respect to a substrate such that the vapors condense or deposit on the substrate to form a coating of the alloy thereon. During deposition a mask is employed such that the coating is applied to the substrate in accordance with a predetermined pattern for forming a plurality of discrete film elements on the substrate. In order to produce film elements having relatively sharp edges and a well defined shape, it is necessary that the mask be held tightly against the substrate onto which the condensate is deposited formed. It is also preferable that the mask be relatively thin to lessen undesirable shadowing of the formed film element when the vapor source is not normal to the substrate surface.

When attempts are made to use a relatively thin mask, problems arise in holding the mask in close contact with the substrate over all the adjacent surface areas since the mask, due to its thin cross sectioned areas, lacks sufficient rigidity, in the direction normal to the substrate surface, to be self-supporting. Also, because it is desirable to heat the substrate prior to the deposition of the material thereon, it is difficult with prior art techniques to maintain the mask in abutting relationship with the surface of the substrate due to coefficient of expansion differentials existing between the mask and substrate member.

The present invention obviates these problems. A thin layer of insulating material is disposed between the mask and the substrate and a potential difference is established across the mask and substrate for effecting a relatively large electrostatic attraction force between the mask and substrate. This force maintains the mask in abutting relationship with the substrate along the entire adjacent surface of the mask.

It is accordingly an object of the present invention to provide a novel arrangement for holding a mask against a substrate in a vacuum deposition apparatus.

It is another object of the present invention to utilize an electrostatic attraction force to maintain a mask in a close relationship to a substrate in a vacuum deposition apparatus.

Figure 2:
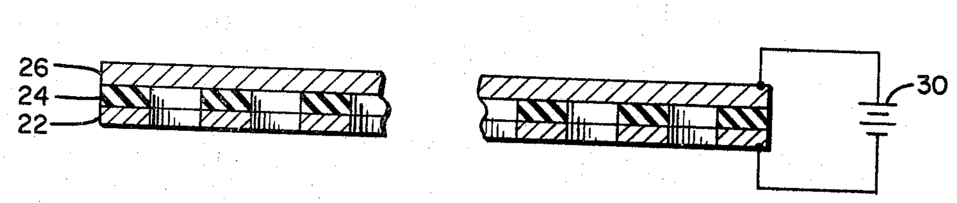

Still other objects of this invention will become apparent to those skilled in the art by reference to the following detailed description of exemplary embodiments and the appended claims. The various features of the exemplary embodiments according to the invention may best be understood with reference to the accompanying drawing, wherein:

FIG. 1 illustrates a typical vacuum deposition apparatus in which the present invention may be advantageously utlized; and FIG. 2 shows a cross sectional view of the substrate and mask along with the means for establishing the electrostatic force which is used to hold the mask against the substrate.

Referring now to FIG. 1, there is shown a bell jar 10 mounted on a supporting plate 12 sealed at rim 14 between the jar and the plate by means of a gasket member. A vacuum pump (not shown) is adapted to be connected to the vacuum system by way of the tubing 16 which passes through the supporting plate.

The melt material, conventionally a metal or metal alloy, to be vapor deposited is located in a crucible 18 which may be inductively heated by the induction heating work coil 20 to a temperature which will cause the metal to be vaporized.

Supported above the crucible 18 by any suitable arrangement is a mask 22 which is formed from an electrically conductive material. Positioned immediately above the mask 22 is a layer of insulating material 24. The insulating layer 24 is preferably formed from silicon monoxide, but limitation to this particular material is not intended since other dielectric materials can be utilized. The layer 24 may be a separable layer or may be coated directly on the upper surface of the mask 22 by a spraying process.

The substrate 26 upon which the films are formed, is preferably made from an electrically conductive material. The insulating layer 24, instead of being a separate element or instead of being coated on the mask 22 may be affixed, as by spraying, directly on the substrate 26. The combination of masks, insulating layer and substrate may then be attached to a substrate heater 28, the construction of which is fully described in the aforereferenced Rubens patent.

As can be seen more clearly from FIG. 2, the mask 22 is preferably formed from a relatively thin sheet of conductive material. A typical cross-sectional dimension of a mask suitable for use in the vacuum deposition apparatus is 1/1000 of an inch. With the mask having this thickness dimension, problems caused by shadowing of the film elements are avoided. However, another problem is introduced. Because the mask is so thin, it lacks rigidity and, hence, it is extremely difficult to maintain the mask in close contact with the substrate over the entire surface area of the mask with conventional means. I have solved this problem by introducing an electrostatic attraction force between the mask and substrate of a sufficiently high magnitude to insure that the top surface of the mask conforms over its entire area with the bottom surface of the substrate. This is accomplished by providing a source of voltage 30 which is connected between the mask and substrate such that a potential difference exists between the mask and substrate. The insulating layer 24 serves to prevent short circuiting of the voltage source 30.

The electrostatic force existing between two parallel plates when separated by a dielectric is directly proportional to the area (A) of the plates multiplied by the square of the potential difference (V) existing across the plates, and inversely to the distance ($t^2$) between the plates. This can be expressed in equation form as follows:

$$F \sim K\frac{AV^2}{t^2}$$

where K is a proportionality constant.

When a thin insulating layer, say 20,000 A. thick along with similar air gaps due to local surface monuniformities, separates the mask and substrate and when a potential difference of between 50 and 100 volts is maintained between the mask and substrate, pressures of several pounds per square inch can be achieved. This pressure tends to hold the mask tightly against the insulating layer and the insulating layer tightly against the substrate member. Because the pressure is quite uniform over the entire surface of the mask, variations in the distance separating the mask from the substrate do not occur as is the case when some mechanical means are relied on for holding the mask in position.

In an evaporation process, ionization of vapor particles may occur and place repelling surface charges on the dielectric. If in a particular application this problem is encountered, it may be solved by applying an alternating current potential across the mask and substrate. The alternating potential will effectively negate the influence of deposited surface charges on the dielectric.

Although the present invention has been shown and described with reference to a single preferred embodiment, it will be appreciated that changes and modifications may be made from a knowledge of the teachings of the present invention which do not, in truth and in fact, depart from the concepts of the invention. Hence the invention is not to be limited or restricted to precisely what is shown and described, but rather should be construed in the light of the fundamentally new principles as embodied in the teachings disclosed herein.

What is claimed is:

1. In apparatus for depositing a metallic coating on a substrate in a predetermined pattern, the combination comprising: a vacuum chamber; a source of metallic vapor contained in said chamber; an electrically conductive substrate positioned to receive said metallic vapors; an electrically conductive thin, flexible mask lacking rigidity in a direction normal to the plane of said mask disposed between said substrate and said source; an electrically insulating material positioned between said mask and said substrate; and means for establishing an electrostatic attractive force between said mask and said substrate to hold said mask in intimate contact with said substrate

2. Apparatus as in claim 1 wherein said insulating material is silicon monoxide.

3. Apparatus as in claim 1 wherein said holding means includes a direct current source.

4. Apparatus as in claim 1 wherein said holding means includes a source of alternating current voltage.

5. In apparatus for vacuum depositing metal in a predetermined pattern on a substrate, the combination comprising: a vacuum chamber; a source of metallic vapor contained within said chamber; an electrically conductive substrate contained within said chamber positioned to receive said vapor; a thin electrically conductive mask having a predetermined pattern of apertures therein positioned in a close but non-contact relationship with respect to said substrate; an insulating medium disposed between said mask and said substrate, and means for applying a potential difference between said mask and said substrate, the resulting electrostatic force serving to hold said mask against said insulating layer over the entire surface of said mask.

References Cited

UNITED STATES PATENTS

| | | | |
|---|---|---|---|
| 2,417,850 | 3/1947 | Winslow | 317—262 X |
| 2,834,132 | 5/1958 | Taylor et al. | 40—125 |
| 3,100,723 | 8/1963 | Weed | 117—93 X |
| 3,170,810 | 2/1965 | Kagan | 118—505 X |
| 3,197,682 | 7/1965 | Klass et al. | |

MORRIS KAPLAN, *Primary Examiner.*